United States Patent
Song et al.

(10) Patent No.: US 10,505,143 B2
(45) Date of Patent: Dec. 10, 2019

(54) DISPLAY SUBSTRATE HAVING DRIVING WIRES AND FABRICATION METHOD THEREOF, DISPLAY PANEL AND DISPLAY APPARATUS

(71) Applicant: BOE TECHNOLOGY GROUP CO., LTD, Beijing (CN)

(72) Inventors: Yingying Song, Beijing (CN); Li Sun, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 3 days.

(21) Appl. No.: 15/122,912

(22) PCT Filed: Feb. 22, 2016

(86) PCT No.: PCT/CN2016/074219
§ 371 (c)(1),
(2) Date: Aug. 31, 2016

(87) PCT Pub. No.: WO2017/024786
PCT Pub. Date: Feb. 16, 2017

(65) Prior Publication Data
US 2017/0186995 A1 Jun. 29, 2017

(30) Foreign Application Priority Data
Aug. 7, 2015 (CN) .......................... 2015 1 0484928

(51) Int. Cl.
*H01L 51/52* (2006.01)
*H01L 27/32* (2006.01)
*H01L 51/56* (2006.01)

(52) U.S. Cl.
CPC ...... *H01L 51/5246* (2013.01); *H01L 27/3251* (2013.01); *H01L 27/3276* (2013.01);
(Continued)

(58) Field of Classification Search
CPC .............. H01L 27/124; H01L 27/3276; H01L 27/3279; H01L 27/3297; H01L 51/0023;
(Continued)

(56) References Cited

U.S. PATENT DOCUMENTS

2002/0167009 A1* 11/2002 Kim .................... G02F 1/13458
257/72
2003/0231149 A1* 12/2003 Kawamura ....... G02F 1/134363
345/76
(Continued)

FOREIGN PATENT DOCUMENTS

| CN | 1643989 A | 7/2005 |
| CN | 102255056 A | 11/2011 |

(Continued)

OTHER PUBLICATIONS

State Intellectual Property Office of the P.R.C (SIPO) Office Action 1 for 201510484928.6 dated Apr. 26, 2016 p. 1-8.
(Continued)

*Primary Examiner* — Changhyun Yi
(74) *Attorney, Agent, or Firm* — Anova Law Group, PLLC

(57) ABSTRACT

The present disclosure provides a display substrate and fabricating method, a display panel, and a display apparatus. The display substrate includes a substrate including a sealing region and a driving wire on the substrate. At least a portion of the driving wire is in the sealing region. The portion of the driving wire includes: a first surface, a second surface opposite to the first surface, and sides there-between connecting to the first surface and the second surface. Each side has a projection width on the substrate of at least about 1 μm.

18 Claims, 3 Drawing Sheets

(52) U.S. Cl.
CPC .......... *H01L 27/3288* (2013.01); *H01L 51/56* (2013.01); *H01L 2227/323* (2013.01)

(58) Field of Classification Search
CPC ............. H01L 51/5209; H01L 51/5225; H01L 51/5243; H01L 51/5246; H01L 51/525; H01L 27/3288
See application file for complete search history.

(56) References Cited

U.S. PATENT DOCUMENTS

| | | | | |
|---|---|---|---|---|
| 2005/0088600 | A1* | 4/2005 | Mizoguchi | G02F 1/134363 349/141 |
| 2007/0242205 | A1* | 10/2007 | Shimura | G02F 1/134363 349/141 |
| 2009/0109384 | A1* | 4/2009 | Kim | G02F 1/133707 349/106 |
| 2011/0018430 | A1 | 1/2011 | Kang et al. | |
| 2015/0060789 | A1 | 3/2015 | Cho et al. | |
| 2015/0219944 | A1* | 8/2015 | Mitsumoto | G02F 1/1339 349/138 |
| 2015/0221889 | A1 | 8/2015 | Zhang | |

FOREIGN PATENT DOCUMENTS

| | | |
|---|---|---|
| CN | 102914915 A | 2/2013 |
| CN | 103078063 A | 5/2013 |
| CN | 203242626 U | 10/2013 |
| CN | 104157792 A | 11/2014 |
| CN | 105185810 A | 12/2015 |
| EP | 1814183 A2 | 8/2007 |
| KR | 101212225 B1 | 12/2012 |

OTHER PUBLICATIONS

State Intellectual Property Office of the P.R.C (SIPO) Office Action 2 for 20151044928.6 dated Nov. 2, 2016 p. 1-7.
The World Intellectual Property Organization (WIPO) International Search Report for PCT/CN2016/074219 dated May 18, 2016 p. 1-5.
The European Patent Office (EPO) The Extended European Search Report for 16753567.3 dated Feb. 22, 2019 9 Pages.

* cited by examiner though the word or any variation of it, is intended to include nonexclusive inclusions. For instance, "comprises" and "comprising" are used to indicate a nonexclusive inclusion.

DISPLAY SUBSTRATE HAVING DRIVING WIRES AND FABRICATION METHOD THEREOF, DISPLAY PANEL AND DISPLAY APPARATUS

CROSS-REFERENCES TO RELATED APPLICATIONS

This application is a national phase entry under 35 U.S.C. § 371 of International Application No. PCT/CN2016/074219, filed on Feb. 22, 2016, which claims priority of Chinese Patent Application No. CN201510484928.6, filed on Aug. 7, 2015. The above enumerated patent applications are incorporated by reference herein in their entirety.

TECHNICAL FIELD

The present disclosure generally relates to the field of display technologies and, more particularly, relates to a display substrate and its fabrication method, a display panel, and a display apparatus.

BACKGROUND

Organic Light-Emitting Diode (OLED) display apparatus may include OLED devices using organic materials. Such organic materials are often easy to react with oxygen and moisture in the air. This may reduce the lifetime and function of the OLED devices. Therefore, it is desirable to strictly separate the OLED devices from moisture and oxygen in the air in order to prolong the lifetime of the OLED devices.

One of the conventional sealing methods for the OLED devices may use welding sealing glass to seal the device. As shown in FIGS. 1-3, a display substrate 1 may include a substrate 10 and a displaying region 11 for display. The display substrate 1 may also include a sealing region 12 in the peripheral area of the displaying region 11. During sealing, a sealing glass 13 may be applied in the sealing region 12, and a sealing substrate 2 may be placed on top of the sealing glass 13. The sealing glass 13 may be welded or fused by laser radiation. The display substrate 1 may be bonded to the sealing substrate 2. The OLED device may thus be sealed in a closed region formed by the two substrates and the sealing glass 13 between the two substrates to avoid the contact with the moisture and oxygen in the air. Such method may provide an excellent sealing ability for 7000 hours under a temperature of 85° C. and relative moisture of 85%. The sealing ability provided by using the sealing glass may be much better than the sealing ability when using UV resin.

However, problems arise. In order to transmit the signal from outside for example from a driving circuit to the OLED devices, a driving wire 14 needs to pass across the sealing region 12 and enter into the displaying region 11. Therefore, the driving wire 14 has to overlap with the sealing region 12. Because the driving wire 14 often has a certain height, the overlapping region may not be uniform. Stress may be generated in the overlapping region to easily break the welding sealing glass 13, causing sealing failure.

The disclosed array substrates and fabrication methods, display panels, and display apparatus are directed to at least partially alleviate one or more problems set forth above and to solve other problems in the art.

BRIEF SUMMARY

One aspect of the present disclosure provides a display substrate. The display substrate includes a substrate including a sealing region and a driving wire on the substrate. At least a portion of the driving wire is in the sealing region. The portion of the driving wire includes: a first surface, a second surface opposite to the first surface, and sides therebetween connecting to the first surface and the second surface. Each side has a projection width on the substrate of at least about 1 μm.

Optionally, the projection width of each side on the substrate is at least about 2 μm.

Optionally, the projection width of each side on the substrate is at most about 5 μm.

Optionally, each side of the portion of the driving wire in the sealing region has a planar surface.

Optionally, each side of the portion of the driving wire in the sealing region has one of a cambered surface and a waving surface.

Optionally, each side of the portion of the driving wire in the sealing region has at least a protrusion.

Optionally, each side of the portion of the driving wire in the sealing region includes a plurality of continuous protrusions.

Optionally, the plurality of continuous protrusions on both sides of the portion of the driving wire in the sealing region has a same three-dimensional shape.

Optionally, each side of the portion of the driving wire in the sealing region includes a plurality of discrete protrusions.

Optionally, the display substrate further includes a displaying region. The sealing region is in a peripheral area near the displaying region to surround the displaying region.

Optionally, the driving wire includes one or more selected from a data line, a common electrode line and a power line.

Another aspect of the present disclosure provides a method for fabricating a display substrate. A substrate including a sealing region is provided. A plurality of driving wires is formed on the substrate. At least a portion of the driving wire is in the sealing region. The portion of the driving wire in the sealing region includes: a first surface, a second surface opposite to the first surface, and sides therebetween connecting to the first surface and the second surface. Each side has a projection width on the substrate of at least about 1 μm.

Optionally, the step of forming the driving wires includes: depositing a metal layer on the substrate, coating a photoresist layer on the metal layer, using a photolithographic process to form a patterned photoresist layer, and etching the metal layer using the patterned photoresist layer as a mask to form the plurality of driving wires.

Another aspect of the present disclosure provides a display panel including two substrates and a sealing glass between the two substrates. At least one of the two substrates includes the disclosed display substrate.

Optionally, the sealing glass is in the sealing region of the display substrate for bonding the two substrates together, and the driving wire is configured to pass across the sealing region.

Another aspect of the present disclosure provides a display apparatus including the disclosed display panel.

Other aspects or embodiments of the present disclosure can be understood by those skilled in the art in light of the description, the claims, and the drawings of the present disclosure.

BRIEF DESCRIPTION OF THE DRAWINGS

The following drawings are merely examples for illustrative purposes according to various disclosed embodiments and are not intended to limit the scope of the present disclosure.

DETAILED DESCRIPTION

Reference will now be made in detail to exemplary embodiments of the disclosure, which are illustrated in the accompanying drawings. Wherever possible, the same reference numbers will be used throughout the drawings to refer to the same or like parts. It should be understood that the exemplary embodiments described herein are only intended to illustrate and explain the present invention and not to limit the invention.

The present disclosure provides array substrates and fabrication methods, display panels, and display apparatus to solve the non-uniformity surface problems of the driving wire at an overlapping region with a welding sealing glass in the sealing region of the display substrate. The present disclosure provides the driving wire with desired sides used as buffer zones for sealing. The present disclosure also increases the contacting area between the driving wire and the welding sealing glass to increase sealing ability of the display substrate. Therefore, the welding sealing glass may not break easily and the sealing yield may be increased.

According to various embodiments, the disclosed display substrate may include a substrate including a sealing region. The disclosed display substrate may further include a driving wire on the substrate and the driving wire includes at least a portion in the sealing region. The portion of the driving wire in the sealing region may include: for example, a first surface, such as a top surface, a second surface opposite to the first surface, such as a bottom surface, on the substrate, and two sides each configured between the first and second surfaces and connecting to each of the first and second surfaces. Each side of the portion of the driving wire in the sealing region has a vertical projection on the substrate with a projection width of at least about 1 μm.

Embodiment 1

Figure 4:
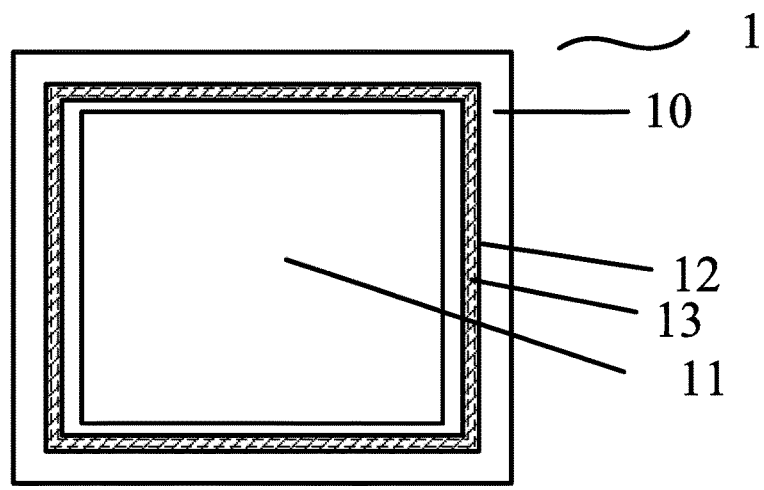
FIG. 4 illustrates a top view of an exemplary display substrate according to various embodiments of the present disclosure.
Figure 5:
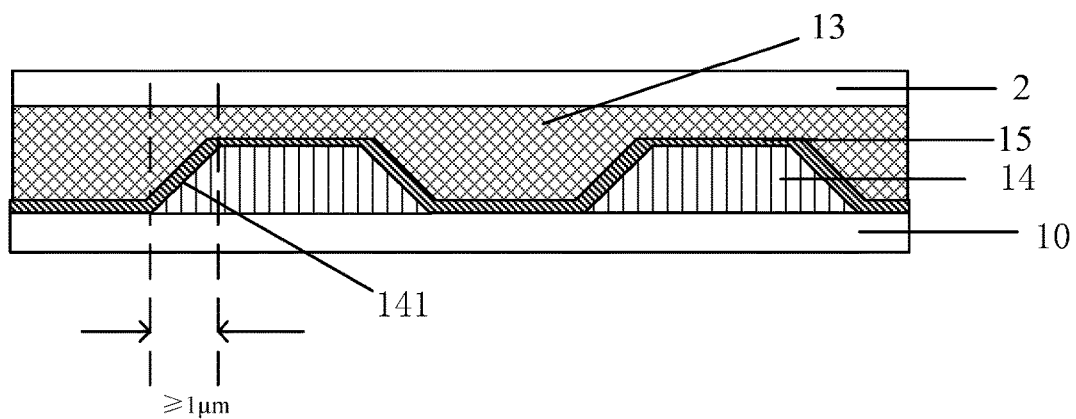
FIG. 5 illustrates a cross-sectional view of the exemplary display substrate according to various embodiments of the present disclosure.
Figure 6:
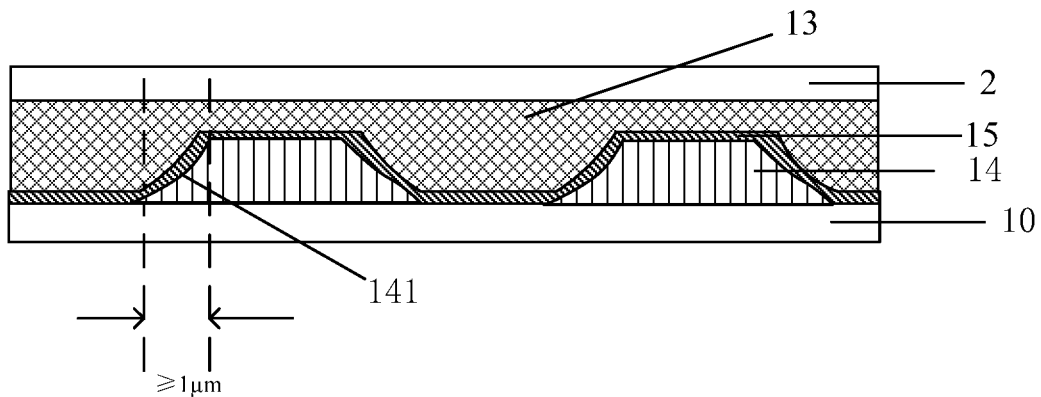
FIG. 6 illustrates another cross-sectional view of the exemplary display substrate according to various embodiments of the present disclosure.

As shown in FIGS. 4-6, the present disclose may provide an exemplary display substrate. The display substrate may include a substrate 10. The substrate 10 may include a sealing region 12 used for sealing. A driving wire 14 may be arranged on the substrate 10. At least a part of the driving wire 14 may be arranged in the sealing region 12. Optionally, an insulating layer 15 may be arranged on the driving wire 14 and the substrate 10.

The display substrate 1 may include a displaying region 11 used for displaying and a sealing region 12 surrounding or enclosing the displaying region 11. OLED devices may be arranged in the displaying region 11. Sealing glass 13 may be arranged in the sealing region 12.

A sealing substrate 2 may be placed on the sealing glass 13. The display substrate 1 may be bonded to the sealing substrate 2 after a laser radiation of the sealing glass 13. The OLED devices may be sealed in the closed region formed by the two substrates, i.e., the display substrate 1 and the sealing substrate 2, and the sealing glass 13 between the two substrates to avoid the moisture and oxygen in the air.

The driving wire 14 may be arranged on the substrate 10. The driving wire 14 may include a data line, a common electrode line, a power line, etc., without any limitations. In order to transmit a signal from an outside source into an OLED device, the driving wire 14 may pass across the sealing region 12 to enter into the displaying region 11. In other words, the driving wire 14 and the insulating layer 15 on the driving wire 14 may be partially overlapped with the sealing region 12. The insulating layer 15 in the sealing region 12 may contact the sealing glass 13 in the sealing region 12. In some embodiments, the driving wire 14 may be a metal driving wire for a better signal transmission.

In the display substrate 1 of one embodiment, the driving wire 14 in the sealing region 12 may include a top surface and a bottom surface configured on a surface of the substrate 10. In some cases, both the top surface and the bottom surface are configured in parallel with the surface of the substrate 10. In other cases, the top surface may not be in parallel with the surface of the substrate 10 but having an angle with the surface of the substrate 10, while the bottom surface is disposed on the substrate 10 and in parallel with the surface of the substrate 10. The driving wire 14 in the sealing region 12 may further include two sides 141 between the top surface and the bottom surface, each side having one end connected to the top surface and having another end connected to the bottom surface.

In various embodiments, the two sides 141 may not be perpendicular or vertical to the top or bottom surface of the driving wire 14 in the sealing region 12. Each of the two sides 141 of the driving wire 14 in the sealing region 12 may form an acute angle with the top or bottom surface of the driving wire 14. The acute angles may be the same or different on both sides. For example, the driving wire 14 in the sealing region 12 in the present embodiment may have a cross-section shape including a trapezium. The vertical projection of each of the sides 141 on the substrate may have a projection width. The projection width may be at least about 1 μm, as shown in FIGS. 5-6.

As such, at least a portion of the driving wire 14 may be in the sealing region 12 and may include: a top surface and a bottom surface in parallel with a surface of the substrate 10, and two sides 141 each respectively connecting to both the top surface and the bottom surface. The vertical projection of each of the sides 141 on the substrate may have a projection width of about 1 μm or greater.

Figure 3:
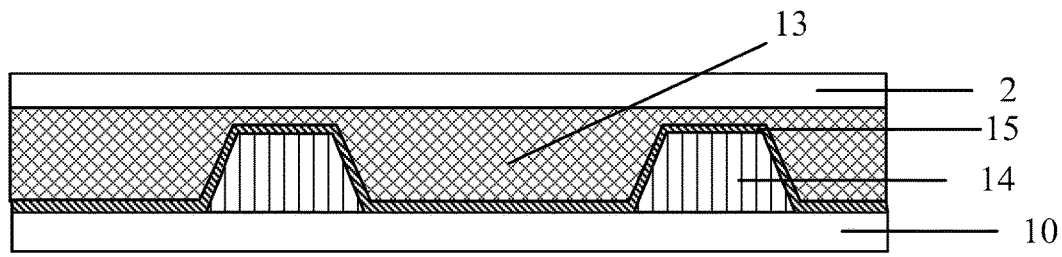
FIG. 3 illustrates a cross-sectional view of the existing display substrate.

In general, for the driving wire 14, a bottom surface may be surely in contact with the substrate 10, a top surface may be opposite to the bottom surface, and the top surface and the bottom surface may be bonded by two sides 141, as shown in FIG. 3. Often, due to the limitation of the fabrication process, the two sides 141 may not be fully perpendicular to the substrate 10. The two sides 141 may be tilted relatively to the substrate 10. Therefore, on the two sides of the driving wire 14, a thickness-tapering region along a direction from inside to the edge of the driving wire 14 may exist. The thickness-tapering region may be shown as the sides 141. The sides 141 may thus each have a projection width projected on the substrate 10. The projection width may be a size perpendicular to a length direction of the driving wire 14. The projection width may also be referred to as width amplitude of the sides 141.

In the present disclosure, the sides 141 may be used as buffer zones for buffering stress generated between the driving wire 14 and the sealing glass 13. The welding sealing glass 13 may thus not be broken easily. In the meantime, the sides 141 may increase the contact area between the driving wire 14 and the sealing glass 13. The sides 141 may increase the sealing ability of the display substrate 1 and increase the sealing yield. Therefore, by increasing the size of the sides 141, the contact area, either direct or indirect, between the driving wire 14 and the sealing glass 13 may be increased and the sealing ability of the display substrate 1 may be increased. As disclosed herein, the projection width of the sides projected on the substrate may be at least about 1 μm.

For example, because the insulating layer 15 is disposed on the driving wire 14, the sealing glass 13 may not be in direct contact with the driving wire 14. The sealing glass 13 may contact the driving wire 14 indirectly. Therefore, the contact area may be an indirect contact area. As disclosed, the sides 141 are configured to increase the indirect contact area between the driving wire 14 and the sealing glass 13. Therefore, the sides 141 in the indirect contact area between the driving wire 14 and the sealing glass 13 may need to follow the size requirements as disclosed herein. The size requirements may include a width requirement of the sides 141 of the driving wire 14 in the sealing region 12 for at least about 1 μm. In one embodiment, considering ease for the fabrication process, all the sides 141 of the driving wire 14 may have a same projection width. However, the sides 141 of the driving wire 14 may have a different projection width.

In some embodiments, the projection width of the vertical projection of the sides 141 on the substrate may be about 2 μm or greater.

In some embodiments, the projection width of the vertical projection of the sides 141 on the substrate may be about 5 μm or less.

The greater the projection width of each of the sides 141 of the driving wire 14 on the substrate, the bonding strength between the welding sealing glass 13 and the driving wire 14 may be better. The display substrate 1 and the sealing substrate 2 may be bonded more tightly. Therefore, the sealing ability of the display substrate 1 may be increased.

However, the size of the driving wire 141 such as the projection width of each of the sides 141 may not be increased unlimitedly. When the overlapping area is too large, the setting of other components or devices may be affected. In addition, for the driving wire 14 having a fixed thickness or height, the wider the side is, the side may be tilted less. Thus, the top surface of the side may be closer to the top surface of the driving wire 14. However, if the top surface of the side is too close to the top surface of the driving wire, the contact area between the driving wire 14 and the sealing glass 13 may not be increased.

One or both sides 141 of the driving wire 14 may have a projection width on the substrate 10 of greater than or equal to about 2 μm, and less than or equal to about 5 μm.

In some embodiments, as shown in FIG. 5, each of the tilted sides 141 of the driving wire 14 may have a top surface including a planar top surface or a flat top surface.

Alternatively, as shown in FIG. 6, each of the tilted sides 141 of the driving wire 14 may have a curved surface such as a cambered surface or a waving surface including concave and convex surfaces.

In various embodiments, the top surface of the driving wire 14 may have a certain shape or pattern in a plane vertical to the top surface, then the contact area between the top surface of the driving wire 14 and the insulating layer 15 may increase. The indirect contact area between the driving wire 14 and the sealing glass 13 may also increase.

In addition to having certain projection width, the sides 141 of the driving wire 14 may have various shapes in accordance with various embodiments. For example, the top surface of the side 141 of the driving wire 14, which is the surface in contact with the sealing glass 13, may be a planar surface as shown in FIG. 5 or a smooth waving surface as shown in FIG. 6. The top surface may also include a plurality of uneven waving surfaces. The shape and morphology of the top surface of the side 141 may affect the bonding ability between the driving wire 14 and the sealing glass 13.

Of course, the shape and morphology of the top surface of the sides 141 of the driving wire 14 may not be limited. Any suitable shapes and morphologies may be used for the top surface of the sides 141 of the driving wire 14.

Embodiment 2

Figure 7:
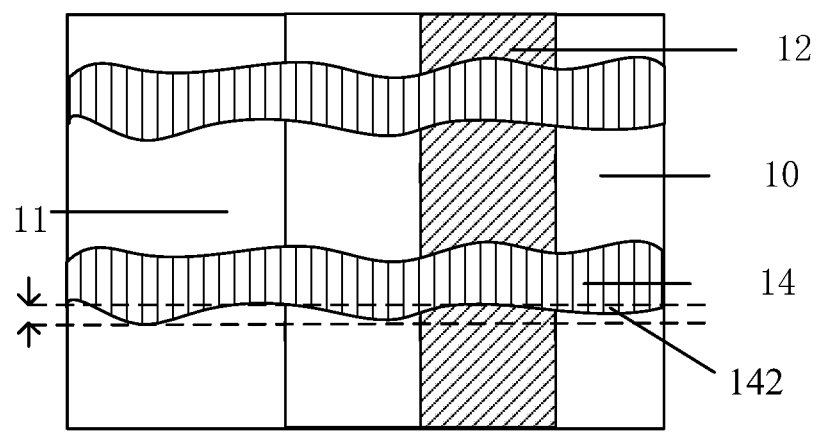
FIG. 7 illustrates a top view of another exemplary display substrate according to various embodiments of the present disclosure.

As shown in FIG. 7, the present embodiment provides a display substrate. The display substrate in FIG. 7 may have a similar structure as the display substrate 1 illustrated in FIGS. 4-6, except that sides 141 of the driving wire 14 in the sealing region 12 in FIG. 7 may further have at least one protrusion 142.

Figure 1:
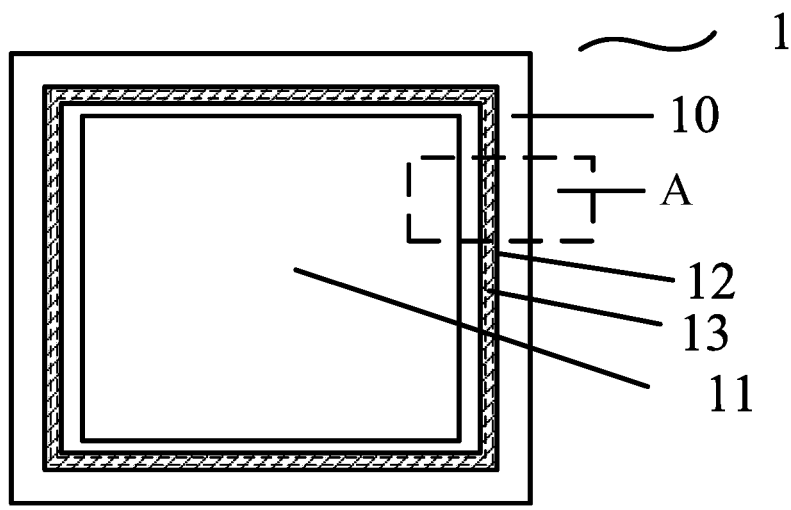
FIG. 1 illustrates a top view of an existing display substrate.
Figure 2:
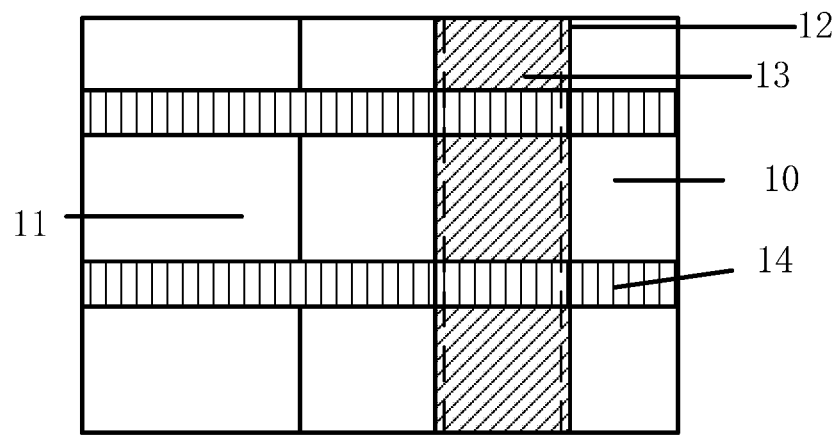
FIG. 2 illustrates an enlarged schematic diagram of the display substrate in A position in FIG. 1.

This is in contrast to the display substrate shown in FIG. 2. As shown in FIG. 2, the sides 141 of the driving wire 14 may be a line when being viewed from a certain direction, without having any protrusions. Therefore, the contact area of the driving wire 14 with the sealing glass 13 may be small. The welding between the sealing glass 13 and the driving wire 14 may not be sufficiently stable. Under a stress, the welding sealing glass 13 may break and the sealing of the display substrate 1 may fail. Therefore, the sealing yield of the display substrate 1 may decrease.

In one embodiment, as shown in FIG. 7, the two sides 141 of the driving wire 14 may not be linear anymore. The two sides 141 may have a profile having a randomly-curved line. The randomly-curved line may have protrusions 142. The protrusions 142 with different numbers, different positions, and different shapes may be arranged along the length of the driving wire 14. Thus, the linear lines may be converted to curved lines having any random cross-section shapes. By this arrangement and comparing with the edges of the linear lines, the edges of the two sides 141 of the driving wire 14 may be arranged having randomly curved shapes or patterns to effectively increase the welding area between the driving wire 14 and the sealing glass 13. Thus, the welding between the driving wire 14 and the sealing glass 13 may be stronger, and the sealing ability of the display substrate 1 may be better. The sealing yield of the display substrate 1 may be improved.

The width of such randomly curved sides of driving wire 14 may be the same or similar as the width of sides of driving wire 14 that do not have protrusions. Because the sides 141 are used to increase the contact area between the driving wire 14 and the sealing glass 13, as long as the driving wire 14 in the sealing region 12 provides desired contact area, other portion(s) of the driving wire 14 outside of the sealing region 12 may have any possible shapes, cross sections, surface morphologies, etc. without limitation. For example, the sides 141 of the driving wire 14 in other regions may still have a linear line or linear profile, e.g., without having any protrusions. However, considering ease of the process flow and the fabricating steps, all edges of the driving wire 14 may be a curved line along a length direction.

In some embodiments, the two sides 141 of the driving wire 14 may include a plurality of continuous protrusions 142, as opposed to discrete protrusions.

In other words, the plurality of the protrusions 142 may be connected with one another. As shown in FIG. 7, the edge of the side 141 may be in the shape of the curved line with random shapes. The edge of the side 141 may not have a linear portion in parallel with the longitudinal or length direction. Alternatively, the protrusions 142 may be discretely arranged having intervals between adjacent protrusions. In this case, the edge of the driving wire 14 may include a plurality of linear lines separated by an interval between adjacent protrusions, plus curved lines between the linear lines.

Figure 8:
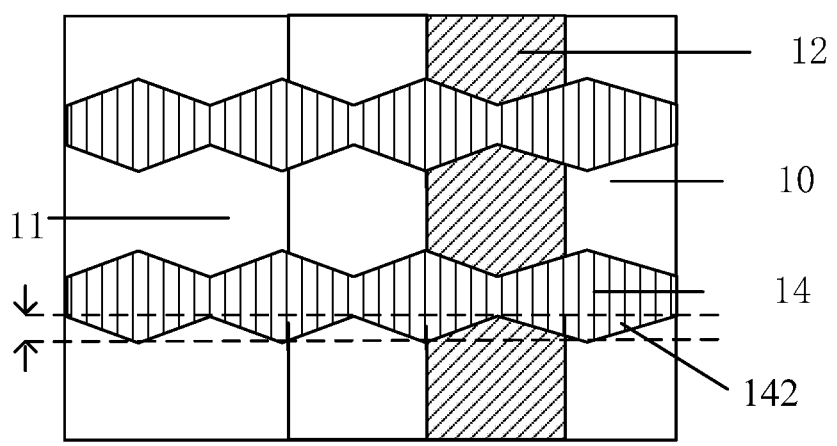
FIG. 8 illustrates a top view of another exemplary display substrate according to various embodiments of the present disclosure.

In some embodiments, as shown in FIG. 8, each of the two sides 141 of the driving wire 14 may have a plurality of the continuous protrusions 142, and each protrusion has a same or similar shape. In addition, the driving wire 14 may have a symmetrical structure, e.g., having a central line or central plane along a longitudinal direction of the driving wire 14. The two sides 141 are symmetrically configured and centered by the central line or central plane of the driving wire 14 along the longitudinal direction of the driving wire 14.

The plurality of the protrusions 142 may have same or similar three-dimensional shapes. The cross-section shape of the sides 141 of the driving wire 14 may include a regularly and periodically curved line. By this arrangement, the contact area, i.e., the indirect contact area, between the sides 141 of the driving wire 14 and the sealing glass 13 may be increased. Therefore, the welding between the driving wire 14 and the sealing glass 13 may be stable.

Alternatively, in one embodiment, the two sides 141 of the driving wire 14 may be arranged to include a plurality of protrusions 142 with irregular shapes.

After all, the purpose of the arrangement of the protrusions 142 is to form a curved line for the side 141 in a cross-section view of the driving wire 14 as shown in FIGS. 7-8. Specific three-dimensional shape, number, and/or position of the protrusions 142 may be determined according to the actual needs and are not limited by FIGS. 7-8.

Of course, it should be appreciated that, even there are protrusions 142, the two sides 141 of the driving wire 14 may at least have a vertical projection on the substrate to provide a projection width of about 1 μm or greater.

As disclosed herein, a plurality of driving wires 14 may be included in one display substrate and may be the same or different. In one embodiment, some driving wires among all driving wires in one display substrate may be the same, other driving wires may be different. For example, a number of driving wires 14 illustrated in FIG. 7 and a number of driving wires 14 illustrated in FIG. 8 may be included in a same display substrate.

Embodiment 3

As shown in FIG. 5 and FIG. 6, various embodiments provide a method for fabricating a display substrate. The display substrate may be any of the display substrates as described in the present disclosure. The fabrication method may include, for example, forming a plurality of driving wires 14 spaced apart and passing across the sealing region 12 to enter into the displaying region 11. The driving wire 14 in the sealing region may at least include a top surface and a bottom surface configured in parallel with the substrate. The top surface and the bottom surface connecting to each of the two sides 141 and each of the two sides 141 may have a projection width of at least about 1 μm.

The fabrication steps for forming the driving wires 14 may include: depositing a metal layer on the substrate by sputtering. A photoresist layer may be coated on the metal layer, followed by a photolithographic process to form a patterned photoresist layer by exposure and developing of the photoresist layer. The metal layer is then etched using the patterned photoresist layer as an etch mask to form the driving wires.

In one embodiment, in order to form the driving wire 14 to have sides 141 with a projection width on the substrate of at least about 1 μm, the angle formed between the side 141 and a surface of the substrate may be decreased. Therefore, in the etching process to form the driving wires 14, the acid ingredients, concentrations, and additives of the etchant solution may be adjusted according to the structure of the to-be-formed driving wire 14.

As such, the display substrate 1 fabricated in the present embodiment may include driving wires 14, and at least a portion of a driving wire 14 in the sealing region 12 includes sides 141 each having a projection width of a vertical projection on the substrate of at least about 1 μm. The projection widths of the two sides of the same driving wire 14 may be the same or different. The sides of the driving wire 14 may be used as buffer zones. Thus, the welding sealing glass 13 may not be broken easily. In the meantime, the contact area of the driving wire 14 and the sealing glass 13 may be increased. The sealing ability of the display substrate 1 may be improved.

In addition, the size, surface shape, and surface morphology of the sides may be controlled and adjusted during the fabrication process of the driving wires 14.

Embodiment 4

As shown in FIGS. 5-8, various embodiments also provide a display panel. The display panel may include two substrates and a sealing glass between the two substrates. At least one of the two substrates may be the display substrate disclosed herein. For example, the sealing glass 13 may be configured in the sealing region 12 to bond the two substrates including the display substrate 1 and the sealing substrate 2. At least a portion of the driving wire 14 may be arranged in the sealing region 12.

The disclosed display panel may include at least one of the display substrates 1 disclosed in FIGS. 5-8. The display substrate 1 may include a displaying region 11 used for displaying and a sealing region 12 configured in a peripheral area near the displaying region 11 and surrounding the displaying region 11. OLED devices may be arranged in the displaying region 11. While sealing, the sealing glass 13 may be in the sealing region 12. The sealing region 12 may be arranged on the display substrate 1. After a laser radiation, the sealing glass 13 may be welded and the display substrate 1 and the sealing substrate 2 may be bonded together. Therefore, the OLED devices may be sealed in the closed region formed by the two substrates and the sealing glass 13 between the two substrates to avoid the moisture and oxygen in the air from contacting the OLED devices.

Embodiment 5

The present embodiment may provide a display apparatus. The display apparatus may include any of the display substrates disclosed in the present disclosure.

The display apparatus may include a liquid crystal panel, an electronic paper, an OLED panel, a cell phone, a tablet, a television, a monitor, a laptop, a digital frame, or a navigation device, or any product or part having a displaying function.

The display apparatus in the present disclosure may include a sealing glass 13 arranged in the sealing region 12. The sealing substrate 2 may be arranged on the display substrate 1. After laser radiation, the sealing glass 13 may be welded to bond the display substrate 1 and the sealing substrate 2 together. The OLED devices may be sealed in the closed region formed by the two substrates and the sealing glass 13 between the two substrates to avoid the moisture and oxygen in the air.

The embodiments disclosed herein are exemplary only. Other applications, advantages, alternations, modifications, or equivalents to the disclosed embodiments are obvious to those skilled in the art and are intended to be encompassed within the scope of the present disclosure.

What is claimed is:

1. A display substrate, comprising:
   a substrate including a displaying region and a sealing region; and
   a driving wire on the substrate,
   wherein:
      at least a portion of the driving wire is in the sealing region that is a peripheral area near the displaying region to surround the displaying region,
      a cross-section of the at least a portion of the driving wire, perpendicular to a length direction of the driving wire, includes: a first edge distal to the substrate, a second edge opposite to the first edge and proximal to the substrate, and side edges connecting the first edge and the second edge,
      a length of the first edge is less than a length of the second edge, and each side edge connecting the first and second edges is tilt relative to a plane of the substrate, and
      a width of a projection of each side edge on the substrate is at least about 1 µm.

2. The display substrate according to claim 1, wherein: the width of the projection of each side edge on the substrate is at least about 2 µm.

3. The display substrate according to claim 1, wherein: the width of the projection of each side edge on the substrate is at most about 5 µm.

4. The display substrate according to claim 1, wherein: each side of the at least a portion of the driving wire in the sealing region has a planar surface.

5. The display substrate according to claim 1, wherein: each side of the at least a portion of the driving wire in the sealing region has a cambered surface or a waving surface.

6. The display substrate according to claim 1, wherein: each side of the at least a portion of the driving wire in the sealing region has at least a protrusion.

7. The display substrate according to claim 6, wherein: each side of the at least a portion of the driving wire in the sealing region includes a plurality of continuous protrusions.

8. The display substrate according to claim 7, wherein: the plurality of continuous protrusions on both sides of the at least a portion of the driving wire in the sealing region has a same three-dimensional shape.

9. The display substrate according to claim 6, wherein: each side of the at least a portion of the driving wire in the sealing region includes a plurality of discrete protrusions.

10. The display substrate according to claim 1, wherein: the driving wire includes one or more selected from a data line, a common electrode line and a power line.

11. A display panel, comprising:
    two substrates and a sealing glass between the two substrates, wherein:
       at least one of the two substrates includes the display substrate according to claim 1.

12. The display panel according to claim 11, wherein: the sealing glass is in the sealing region of the display substrate for bonding the two substrates together, and the driving wire is configured to pass across the sealing region.

13. A display apparatus, comprising:
    the display panel according to claim 11.

14. A method for fabricating a display substrate, comprising:
    providing a substrate including a displaying region and a sealing region; and
    forming a plurality of driving wires on the substrate, wherein:
       at least a portion of the driving wire is in the sealing region that is a peripheral area near the displaying region to surround the displaying region,
       a cross-section of the at least a portion of the driving wire, perpendicular to a length direction of the driving wire, includes: a first edge distal to the substrate, a second edge opposite to the first edge and proximal to the substrate, and side edges connecting the first edge and the second edge,
       a length of the first edge is less than a length of the second edge and each side edge connecting the first and second edges is tilt relative to a plane of the substrate, and
       a width of a projection of each side edge on the substrate is at least about 1 µm.

15. The method for fabricating the display substrate according to claim 14, wherein the step of forming the driving wires comprises:
    depositing a metal layer on the substrate,
    coating a photoresist layer on the metal layer,
    using a photolithographic process to form a patterned photoresist layer, and
    etching the metal layer using the patterned photoresist layer as a mask to form the plurality of driving wires.

16. The method for fabricating the display substrate according to claim 14, wherein:
    the width of the projection of each side edge on the substrate is at least about 2 µm.

17. The method for fabricating the display substrate according to claim 14, wherein:
    the width of the projection of each side edge on the substrate is at most about 5 µm.

18. The method for fabricating the display substrate according to claim 14, wherein:
  the driving wire includes one or more selected from a data line, a common electrode line and a power line.

\* \* \* \* \*